United States Patent
Nagayoshi et al.

(10) Patent No.: US 10,770,889 B2
(45) Date of Patent: Sep. 8, 2020

(54) SEMICONDUCTOR CIRCUIT

(71) Applicant: HONDA MOTOR CO., LTD., Tokyo (JP)

(72) Inventors: Shogo Nagayoshi, Tochigi (JP); Shinya Watanabe, Tochigi (JP); Yasuhisa Saito, Tochigi (JP); Hitoshi Saito, Tochigi (JP); Shinyu Hirayama, Tochigi (JP); Hironori Sawamura, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 429 days.

(21) Appl. No.: 15/870,114

(22) Filed: Jan. 12, 2018

(65) Prior Publication Data

US 2018/0205219 A1 Jul. 19, 2018

(30) Foreign Application Priority Data

Jan. 16, 2017 (JP) ................................ 2017-004873

(51) Int. Cl.
| | | |
|---|---|---|
| *H02H 7/122* | (2006.01) | |
| *H01L 23/50* | (2006.01) | |
| *H01L 23/64* | (2006.01) | |
| *H02M 1/08* | (2006.01) | |
| *H03K 17/0814* | (2006.01) | |
| *H02M 7/48* | (2007.01) | |

(Continued)

(52) U.S. Cl.
CPC ........... *H02H 7/1227* (2013.01); *H01L 23/50* (2013.01); *H01L 23/645* (2013.01); *H02M 1/08* (2013.01); *H02M 1/088* (2013.01); *H02M 1/32* (2013.01); *H02M 7/48* (2013.01); *H03K 17/0828* (2013.01); *H03K 17/08148* (2013.01); *H03K 17/14* (2013.01); *H01L 25/072* (2013.01); *H02M 2007/4822* (2013.01)

(58) Field of Classification Search
CPC ..... H01L 23/50; H01L 23/645; H02H 7/1227; H02M 1/088; H02M 1/32; H02M 7/003; H02M 7/48; H02M 7/4822; H03K 17/08–0828; H03K 17/14
See application file for complete search history.

(56) References Cited

U.S. PATENT DOCUMENTS 10,210,982 B1 * 2/2019 Xu .................. H01F 17/062
10,574,223 B1 * 2/2020 Xu .................. H03K 17/0424
(Continued)

FOREIGN PATENT DOCUMENTS

| JP | 06-113549 | 4/1994 |
|---|---|---|
| JP | 3456836 | 10/2003 |
| JP | 2015-029397 | 2/2015 |

*Primary Examiner* — Jared Fureman
*Assistant Examiner* — Christopher J Clark
(74) *Attorney, Agent, or Firm* — Rankin, Hill & Clark LLP (57) ABSTRACT

To provide a semiconductor circuit capable of slightly generating inductance in two facing bus bars. Provided with a semiconductor circuit in which a collector-side bus bar 46 and an emitter-side bus bar 41 are arranged in parallel in a state of being isolated from each other and are fitted in a fixed manner to each other, and a inductance generation portion 411 is provided in one or both of the collector-side bus bar 46 and the emitter-side bus bar 41, the inductance generation portion 411 generating a difference in inductance between the collector-side bus bar 46 and the emitter-side bus bar 41.

4 Claims, 8 Drawing Sheets

(51) Int. Cl.
*H03K 17/14* (2006.01)
*H02M 1/32* (2007.01)
*H02M 1/088* (2006.01)
*H03K 17/082* (2006.01)
*H01L 25/07* (2006.01)

(56) References Cited

U.S. PATENT DOCUMENTS

2017/0047727 A1\* 2/2017 Cao ................ H02H 7/1252
2018/0123579 A1\* 5/2018 Fink ................ H03K 17/127

\* cited by examiner

SEMICONDUCTOR CIRCUIT

This application is based on and claims the benefit of priority from Japanese Patent Application No. 2017-004873, filed on 16 Jan. 2017, the content of which is incorporated herein by reference.

BACKGROUND OF THE INVENTION

Field of the Invention

The present invention relates to a semiconductor circuit used in a semiconductor power conversion device having a function to protect semiconductor switches from breakdown caused due to a delay in turning off a semiconductor switch, the delay occurring due to individual variation of the plurality of semiconductor switches.

Related Art

Conventionally, in a semiconductor power conversion device provided with a plurality of semiconductor switches connected in parallel, a configuration including a circuit that protects the semiconductor switches at the time of turning on the semiconductor switches is known (for example, Patent Document 1). A transformer including two windings having the same number of turns is electrically connected to emitter auxiliary terminals of insulated gate bipolar transistors (IG-BTs) connected in parallel. A flow of a current in the emitter auxiliary terminals at the time of turn-on due to a difference in characteristics of the IGBTs connected in parallel is suppressed by impedance of the two windings.

Further, in a semiconductor power conversion device provided with a plurality of semiconductor switches connected in parallel, a configuration including a circuit that prevents failure associated with a short circuiting of a semiconductor switch is known (for example, Patent Document 2). Common mode suppressing elements as inter-switch current suppression portions are respectively provided in signal lines between a drive circuit for turning on or turning off the semiconductor switches at the same time, and gates (control signal input terminals) and emitters (current output terminals) of the semiconductor switches. The common mode suppressing element is configured from a common mode coil in which facing coils are configured in so-called forward winding, and the like.

In Patent Document 2, the plurality of semiconductor switches is connected in parallel to configure arms. When a semiconductor switch of an upper arm is turned to be an on state in a state where a semiconductor switch of a lower arm breaks down due to a short circuit of the semiconductor switch, the upper and lower arms are short circuited. At this time, a flow of a current between emitters is suppressed due to an action of the common mode suppressing element, and deviation in voltage is suppressed.

In the above-described conventional technology, the current flowing into an emitter auxiliary line is suppressed by an increase in a potential of the emitter due to inductance of an emitter main electric circuit. However, variation in current in the plurality of switching elements occurs. Further, if the inductance of the emitter main electric circuit is decreased in order to decrease a loss, the variation in current of the plurality of switching elements is increased.

Further, in the semiconductor power conversion device provided with a plurality of semiconductor switches connected in parallel, a delay in timing when a semiconductor switch is switched to the off state occurs due to individual variation in the semiconductor switches at the time of turning off the semiconductor switches. With the delay, deviation in current occurs, and a current stops flowing into the semiconductor switches already in the off state and flows into the semiconductor switch delayed in switching to the off state, and the semiconductor switch breaks down. Therefore, providing an inter-switch current suppression portion between the plurality of semiconductor switches is conceivable. In this case, the inter-switch current suppression portion is provided in a signal line between the drive circuit, and a control signal input terminal and a current output terminal of the semiconductor switch, for example, and is configured from oppositely wound coils facing each other.

Then, a current lead wire connected to collector terminals of the semiconductor switches from a positive pole is configured from a collector-side bus bar branched from the collector terminals of adjacent semiconductor switches. Further, a current lead wire connected to a negative pole from emitter-side terminals of the semiconductor switches is configured from an emitter-side bus bar branched from the emitter terminals of the adjacent semiconductor switches. Further, conventionally, making bus bars of equal length that connect terminals, arranging two bus bars to face each other, and bringing a balancer portion including a core to pass through the bus bars to cause currents to flow in opposite directions, thereby to favorably balance the currents is known (for example, see Patent Document 3).

Patent Document 1: Japanese Patent No. 3456836
Patent Document 2: Japanese Unexamined Patent Application, Publication No. 2015-029397
Patent Document 3: Japanese Unexamined Patent Application, Publication No. H06-113549

SUMMARY OF THE INVENTION

In the conventional technology described in Patent Document 3, the two bus bars are configured to face each other to cause the currents to flow in the opposite directions, and unnecessary inductance is canceled. With the configuration, an increase in a turn-off surge voltage component is suppressed, and breakdown of the switching element can be avoided. However, if the unnecessary inductance is canceled, the inter-switch current suppression portion provided between the plurality of semiconductor switches does not function.

An object of the present invention is to provide a semiconductor circuit capable of slightly generating inductance in two facing bus bars.

To achieve the above object, the present invention provides a semiconductor circuit including a plurality of semiconductor switches (for example, semiconductor switches 30 described below) arranged in parallel to one another and configuring arms connected between positive and negative poles of a DC power supply, and a drive circuit (for example, a gate drive circuit 10 described below) configured to cause the plurality of semiconductor switches of the arms to switch to an on state or an off state at the same time, wherein the drive circuit includes means to detect a short circuit of a semiconductor switch and cause the short-circuited semiconductor switch to switch to the off state, an inter-switch current suppression portion (for example, an inter-switch current suppression portion 20 described below) is electrically connected to signal lines (for example, emitter auxiliary lines 311, 321, 331, 312, and 322, 332 and signal lines 313, 323, 333, 314, 324, and 334) between the drive circuit, and control signal input terminals and current output terminals of the semiconductor switches, the inter-switch current suppression portion includes oppositely wound coils facing each other, and is a semiconductor circuit that configures a semiconductor power conversion device (for example, a semiconductor power conversion device 1 described below) that facilitates the semiconductor switches to switch to the off state with the drive circuit, using an inter-switch current flowing between the current output terminals of the plurality of semiconductor switches, a current lead wire connected from the positive pole (for example, a semiconductor circuit 100 described below) to collector terminals of the semiconductor switches is configured from a collector-side bus bar (for example, a collector-side bus bar 46 described below) branched in an equal manner from the collector terminals of the adjacent semiconductor switches, a current lead wire connected from emitter-side terminals of the semiconductor switches to the negative pole (for example, an AC output terminal (negative pole) U described below) is configured from an emitter-side bus bar (for example, an emitter-side bus bar 41 described below) branched in an equal manner to emitter terminals of the adjacent semiconductor switches, the collector-side bus bar and the emitter-side bus bar are arranged in parallel in a state of being isolated from each other and are fitted in a fixed manner to each other, and an inductance generation portion (for example, a protruding groove portion 411, a protruding groove portion 411B, a slit 411C, or an inter-bus bar separation portion 411D described below) is provided in one or both of the collector-side bus bar and the emitter-side bus bar, the inductance generation portion generating a difference in inductance between the collector-side bus bar and the emitter-side bus bar.

According to the present invention, in the inductance generation portion, the inductance generated on the emitter-side bus bar side and the inductance generated on the collector-side bus bar side are not perfectly canceled and the inductance is ensured. As a result, in a case where a delay in timing of switching to the off state occurs in any of the plurality of semiconductor switches due to individual variation of the semiconductor switches, a feedback can be applied to the control signal input terminal of the delayed semiconductor switch, and the delayed semiconductor switch can be promptly caused to switch to the off state. Therefore, a current that has stopped flowing in the semiconductor switches already in the off state is prevented from flowing into the delayed semiconductor switch as a large current, and breakdown of the semiconductor switch can be avoided. Further, an output of the inter-switch current suppression portion works in a direction of narrowing down a voltage to be applied to the control signal input terminal by a voltage due to the current deviation at the time of turn-off. Therefore, the current deviation occurring can be suppressed to be extremely small.

Further, the inductance generation portion is configured from a groove (for example, a protruding groove portion 411 or a protruding groove portion 411B described below) formed in at least one of the collector-side bus bar and the emitter-side bus bar. Therefore, the respective facing surfaces of the collector-side bus bar and the emitter-side bus bar are separated by and arranged at a predetermined distance due to the formation of the groove, and thus a binding rate of magnetic flux becomes worse, and inductance generated on the emitter-side bus bar side and inductance generated on the collector-side bus bar side are not perfectly canceled or canceled in a less perfect manner. With the configuration, the inductance can be ensured.

Further, the inductance generation portion is configured from a slit (for example, a slit 411C described below) formed in at least one of the collector-side bus bar and the emitter-side bus bar. Therefore, the respective facing surfaces of the collector-side bus bar and the emitter-side bus bar are separated by and arranged at a predetermined distance by the amount of the slit, and thus a binding rate of magnetic flux becomes worse, and inductance generated on the emitter-side bus bar side and the inductance generated on the collector-side bus bar side are not perfectly canceled or canceled in a less perfect manner.

Further, the inductance generation portion is configured from a portion (for example, an inter-bus bar separation portion 411D described below) which the collector-side bus bar and the emitter-side bus bar are separated by and arranged at a predetermined distance.

Therefore, the collector-side bus bar and the emitter-side bus bar can be configured in the same shape, the respective facing surfaces of the collector-side bus bar and the emitter-side bus bar are separated by and arranged at a predetermined distance and thus a binding rate of magnetic flux becomes worse, and the inductance generated on the emitter-side bus bar side and the inductance generated on the collector-side bus bar side are not perfectly canceled or canceled in a less perfect manner, whereby an inductance generation portion can be configured. Therefore, a semiconductor circuit can be configured without applying special processing to the emitter-side bus bar and the collector-side bus bar.

According to the present invention, a semiconductor circuit capable of slightly generating inductance in two facing bus bars may be provided.

DETAILED DESCRIPTION OF THE INVENTION

Figure 1:
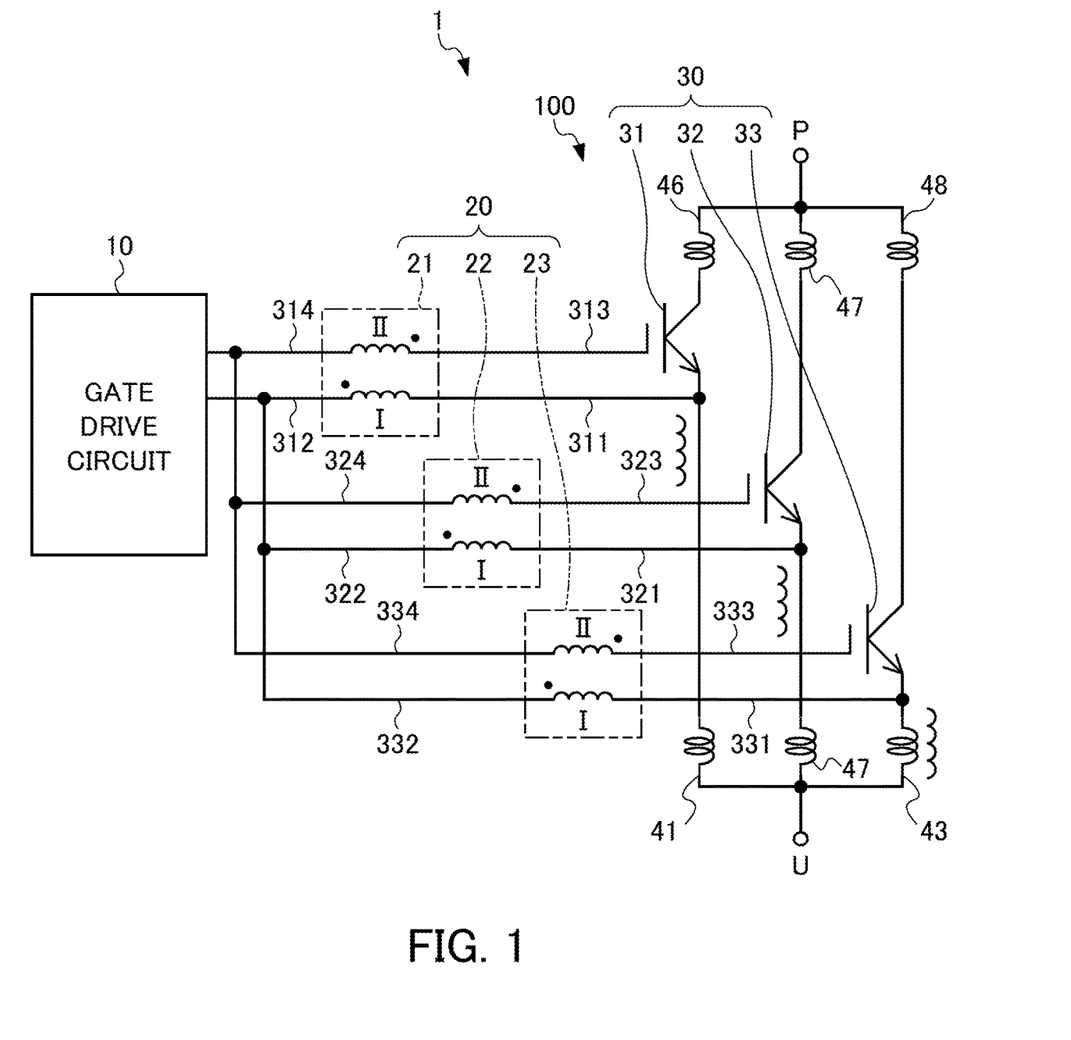
FIG. 1 is a circuit diagram illustrating a semiconductor power conversion device 1 including a semiconductor circuit 100 according to a first embodiment of the present invention.

A first embodiment of the present invention will be described in detail with reference to the drawings. FIG. 1 is a circuit diagram illustrating a semiconductor power conversion device 1 including a semiconductor circuit 100 according to the first embodiment of the present invention.

As illustrated in FIG. 1, the semiconductor power conversion device 1 includes a gate drive circuit 10, an inter-switch current suppression portion 20, and three semiconductor switches 30. The gate drive circuit 10 includes a control unit (not illustrated). A gate drive voltage to be supplied to gate terminals of the semiconductor switches 30 is changed with respect to a potential of emitter terminals by control of the control unit, thereby to switch an off state and an on state in the three semiconductor switches 30 at the same time. The gate drive circuit 10 detects a short circuit in the semiconductor switch 30 by control of the control unit and can cause the semiconductor switch 30 to switch to the off state.

The three semiconductor switches 30 include a first semiconductor switch 31, a second semiconductor switch 32, and a third semiconductor switch 33, and these semiconductor switches are each configured from insulated gate bipolar transistors (IGBTs). The three semiconductor switches 30 configure arms in the semiconductor power conversion device 1, and are electrically connected in parallel to one another between a positive pole P of a DC power supply (not illustrated) and an AC output terminal (negative pole) U. To be specific, collector terminals of the semiconductor switches 30 are each electrically connected to the positive pole P of the DC power supply (not illustrated) via collector-side bus bars 46, 47, and 48 as current lead wires described below. Emitter terminals of the semiconductor switches 30 are each electrically connected to the AC output terminal U via emitter-side bus bars 41, 42, and 43 as current lead wires described below. Further, the emitter terminals of the semiconductor switches 30 are electrically connected to the gate drive circuit 10 via emitter auxiliary lines 311, 321, 331, 312, 322, and 332 configured from signal lines. Gate terminals of the semiconductor switches 30 are each electrically connected to the gate drive circuit 10 via signal lines 313, 323, 333, 314, 324, and 334.

Transformers as inter-switch current suppression portions 20 are provided between the semiconductor switches 31 to 33, and the gate drive circuit 10. That is, a first transformer 21 is provided between the first semiconductor switch 31 and the gate drive circuit 10, a second transformer 22 is provided between the second semiconductor switch 32 and the gate drive circuit 10, and a third transformer 23 is provided between the third semiconductor switch 33 and the gate drive circuit 10. The inter-switch current suppression portions 20 facilitate an operation to turn off the semiconductor switch 30 by the gate drive circuit 10 with respect to any one of the first semiconductor switch 31 to the third semiconductor switch 33, the one having occurrence of a delay in timing of switching to the off state, using inter-switch currents flowing in the emitter auxiliary lines 311, 321, and 331 from the emitter terminals as current output terminals of the three semiconductor switches 30, in controlling the first semiconductor switch 31 to the third semiconductor switch 33 to be switched to the off state by the gate drive circuit 10.

Figure 2:
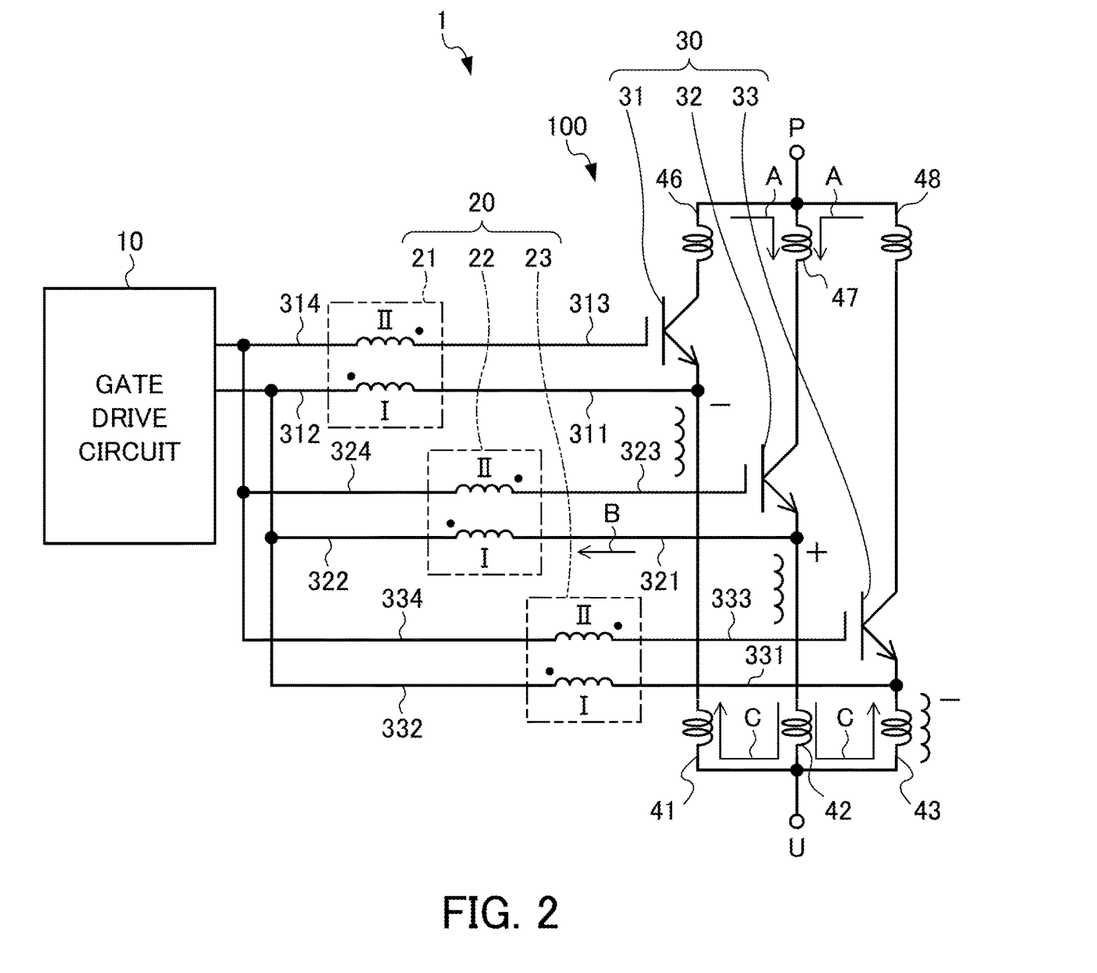
FIG. 2 is a circuit diagram illustrating a flow of a current at the time of turning off a first semiconductor switch 31 to a third semiconductor switch 33 in the semiconductor power conversion device 1 including the semiconductor circuit 100 according to the first embodiment of the present invention.

To be specific, the transformers configuring the first transformer 21 to the third transformer 23 are provided with coils, each coil including two windings of a primary-side winding (I illustrated in FIGS. 1 and 2) and a secondary-side winding (II illustrated in FIGS. 1 and 2). The primary-side winding and the secondary-side winding are in an opposite winding state to each other, that is, the winding direction of the secondary-side winding is in the opposite direction to the winding direction of the primary-side winding. For example, in a case where an axis of the primary-side winding and an axis of the secondary-side winding are arranged in a parallel positional relationship, and the axis of the primary-side winding and the secondary-side winding are viewed from one end side in an axial direction, the primary-side winding is right hand wound and the secondary-side winding is left hand wound, or the primary-side winding is left hand wound and the secondary-side winding is right hand wound.

Further, the number of turns of the secondary-side winding is set to be equivalent to or larger than the number of turns of the primary-side winding. The primary-side winding and the secondary-side winding face each other to configure the transformer (each of the transformers 21 to 23). One end portions of the primary-side windings of the transformers 21, 22, and 23 are electrically connected to the emitter terminals of the semiconductor switches 31 to 33 via the emitter auxiliary lines 311, 321, and 331 configured from signal lines. The other end portions of the primary-side windings of the transformers are electrically connected to the gate drive circuit 10 via the emitter auxiliary lines 312, 322, and 332 configured from signal lines. One end portions of the secondary-side windings of the transformers are electrically connected to the gate drive circuit 10 via the signal lines 314, 324, and 334. The other end portions of the secondary-side windings of the transformers are electrically connected to the gate terminals of the semiconductor switches 31 to 33 via the signal lines 313, 323, and 333.

Figure 3:
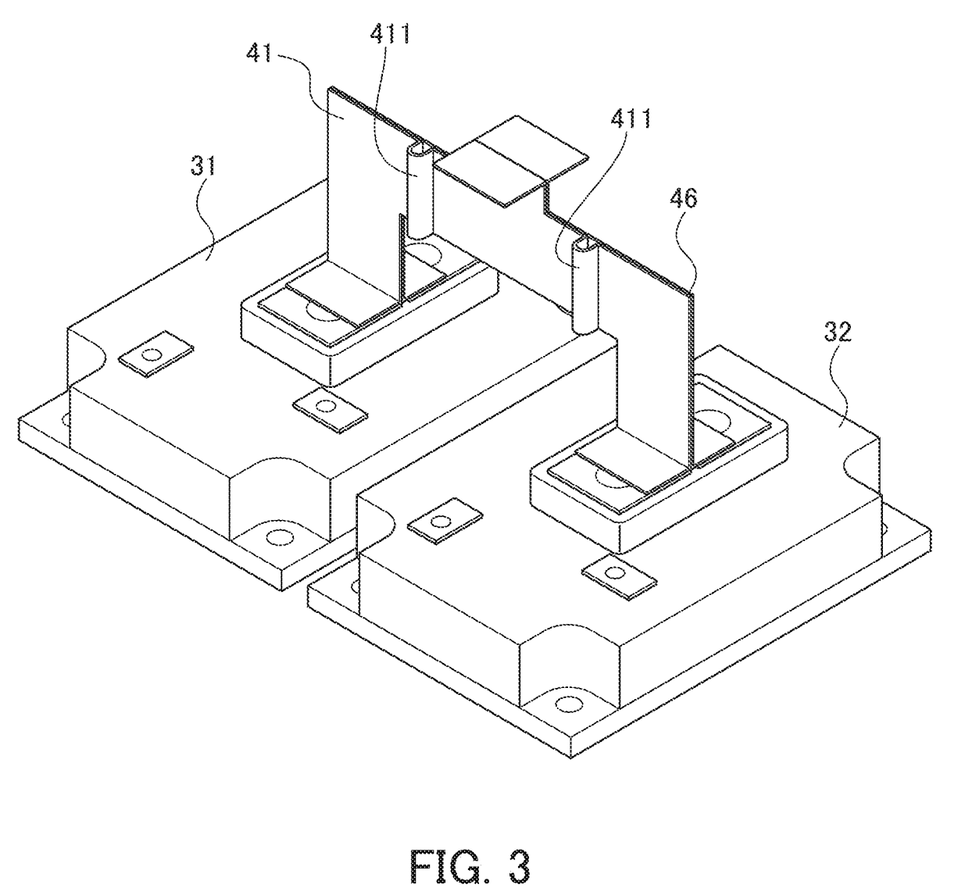
FIG. 3 is a perspective view illustrating an emitter-side bus bar 41 and a collector-side bus bar 46 of the semiconductor circuit 100 according to the first embodiment of the present invention.
Figure 5A:
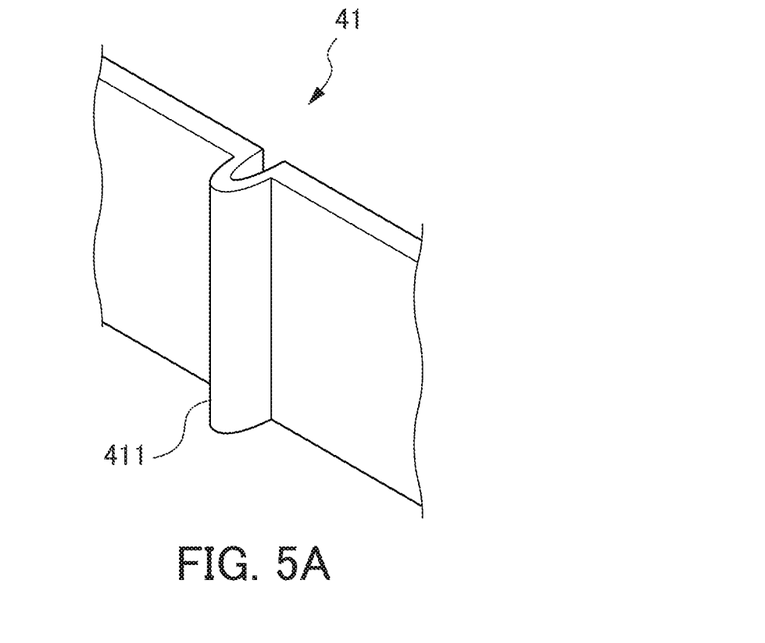
FIG. 5A is a perspective view and FIG. 5B is a side view, illustrating the emitter-side bus bar 41 of the semiconductor circuit 100 according to the first embodiment of the present invention.
Figure 5B:
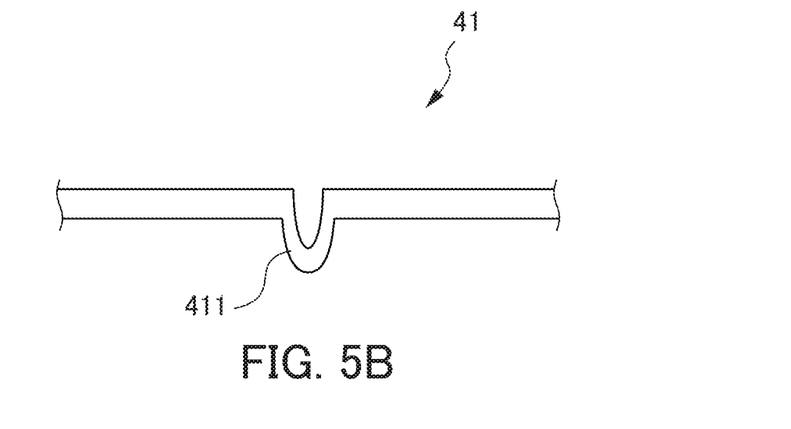

Next, the emitter-side bus bars 41, 42, and 43 and the collector-side bus bars 46, 47, and 48 will be described. FIG. 3 is a perspective view illustrating the emitter-side bus bar 41 and the collector-side bus bar 46 of the semiconductor circuit 100 according to the first embodiment of the present invention. FIG. 5A is a perspective view and FIG. 5B is a side view, illustrating the emitter-side bus bar 41 of the semiconductor circuit 100 according to the first embodiment of the present invention. The emitter-side bus bars 41, 42, and 43 have the same configuration. Therefore, only the emitter-side bus bar 41 will be described. Similarly, the collector-side bus bars 46, 47, and 48 have the same configuration. Therefore, only the collector-side bus bar 46 will be described.

The emitter-side bus bar 41 and the collector-side bus bar 46 have plate shapes having approximately the same U-shaped contour. One surface of the plate-like emitter-side bus bar 41 is affixed and fixed to one surface of the plate-like collector-side bus bar 46 via an insulating material. That is, the emitter-side bus bar 41 and the collector-side bus bar 46 are arranged at an extremely close distance in an insulated state and in a close positional relationship. Here, the extremely close distance means a distance enabling a possibility of canceling the inductance generated on the emitter-side bus bar 41 side due to the flow of the current in the emitter-side bus bar 41 and the inductance generated on the collector-side bus bar 46 side due to the flow of the current in the collector-side bus bar 46. Note that, in FIG. 3, the emitter-side bus bar 41 appears on the near side and the collector-side bus bar 46 is positioned behind it.

One end portions of the collector-side bus bars 46, 47, and 48 are each electrically connected to any of the first semiconductor switch 31 to the third semiconductor switch 33. The first semiconductor switch 31 to the third semiconductor switch 33 are arranged in parallel, and the other end portions of the collector-side bus bars 46, 47, and 48 are each electrically connected to any of the collectors of the first semiconductor switch 31 to the third semiconductor switch 33 adjacent to the first semiconductor switch 31 to the third semiconductor switch 33 to which the one end portions of the collector-side bus bars 46, 47, and 48 are electrically connected.

To be specific, the one end portion of the collector-side bus bar 46 is connected to the collector of the first semiconductor switch 31, the other end portion of the collector-side bus bar 46 is connected to the collector of the second semiconductor switch 32 via the collector-side bus bar 47. Further, the one end portion of the collector-side bus bar 48 is connected to the collector of the third semiconductor switch 33, and the other end portion of the collector-side bus bar 48 is connected to the collector of the second semiconductor switch 32 via the collector-side bus bar 47. Halfway portions of the collector-side bus bars 46, 47, and 48 are electrically connected to the positive pole P of the DC power supply (not illustrated).

One end portions of the emitter-side bus bars 41, 42, and 43 are each electrically connected to any of the emitters of the first semiconductor switch 31 to the third semiconductor switch 33. The other end portions of the emitter-side bus bars 41, 42, and 43 are each electrically connected to any of the emitters of the first semiconductor switch 31 to the third semiconductor switch 33 adjacent to the first semiconductor switch 31 to the third semiconductor switch 33 to which the one end portions of the emitter-side bus bars 41, 42, and 43 are electrically connected.

To be specific, the one end portion of the emitter-side bus bar 41 is connected to the emitter of the first semiconductor switch 31, and the other end portion of the emitter-side bus bar 41 is connected to the emitter of the second semiconductor switch 32 via the emitter-side bus bar 42. Further, the one end portion of the emitter-side bus bar 43 is connected to the emitter of the third semiconductor switch 33, and the other end portion of the emitter-side bus bar 43 is connected to the emitter of the second semiconductor switch 32 via the emitter-side bus bar 42. Halfway portions of the emitter-side bus bars 41, 42, and 43 are electrically connected to the AC output terminal U.

The emitter-side bus bar 41 has a protruding groove portion 411 as an inductance generation portion. The protruding groove portion 411 forms a U-shaped groove, and extends, as illustrated in FIG. 3 and FIG. 5A, in a middle of the emitter-side bus bar 41 from one end edge to the other end edge of the width of the emitter-side bus bar 41 in a width direction (an up and down direction in FIG. 3) of the emitter-side bus bar 41. The protruding groove portion 411 is depressed in one surface of the plate-like emitter-side bus bar 41, and protrudes from the other surface of the plate-like emitter-side bus bar 41 by the amount of depression in the one surface of the emitter-side bus bar 41.

In contrast, the collector-side bus bar 46 does not have the protruding groove portion 411, and the one surface and the other surface of the plate-like collector-side bus bar 46 are each configured from flat planes. Therefore, the respective facing surfaces of the collector-side bus bar 46 and the emitter-side bus bar 41 are separated by and arranged at a predetermined distance due to the formation of the protruding groove portion 411, and thus a binding rate of magnetic flux becomes worse, and the inductance generated on the emitter-side bus bar 41 side and the inductance generated on the collector-side bus bar 46 side are not perfectly canceled or canceled in a less perfect manner. As a result, small inductance is ensured.

Figure 4:
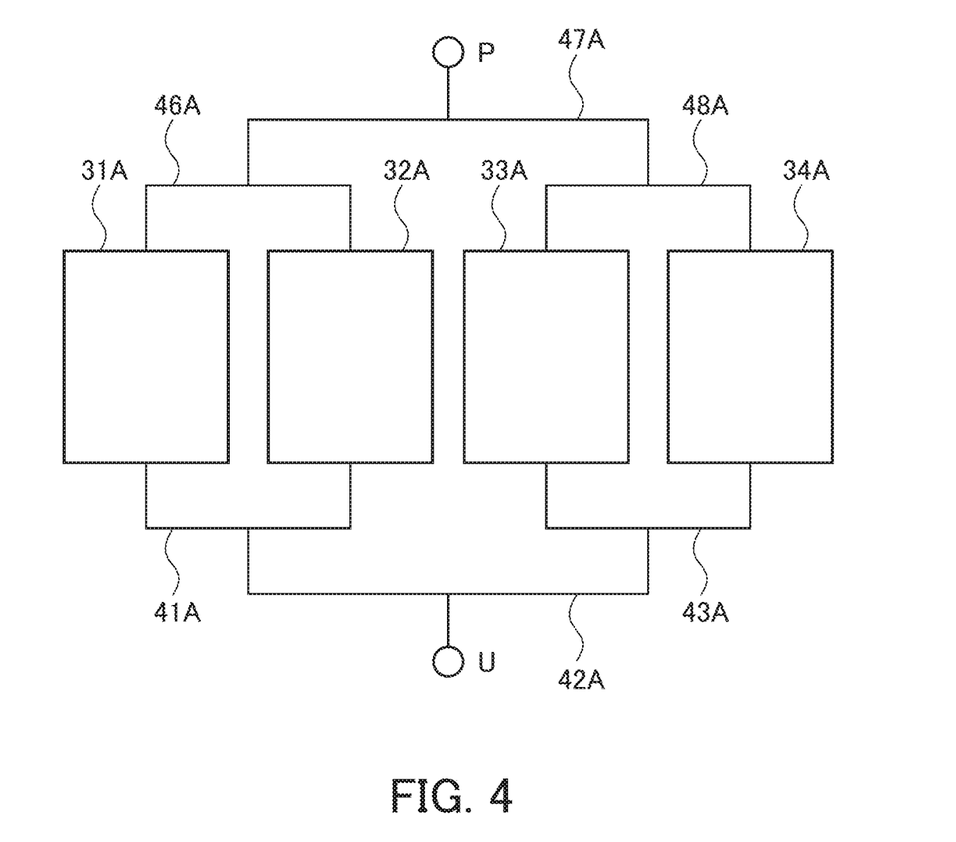
FIG. 4 is a conceptual diagram illustrating connection between the emitter-side bus bar 41 and the collector-side bus bar 46 of the semiconductor circuit 100.

Then, the emitter-side bus bar is branched in an equal manner to the emitter terminals of the adjacent semiconductor switches, and the collector-side bus bar is branched in an equal manner to the collector terminals of the adjacent semiconductor switches. To be specific, for example, as illustrated in FIG. 4, emitter-side bus bars 41A, 42A, and 43A and collector-side bus bars 46A, 47A, and 48A are branched in an equal and uniform manner and are electrically connected to a first semiconductor switch 31A to a fourth semiconductor switch 34A like a tournament bracket. FIG. 4 is a conceptual diagram illustrating connection between the emitter-side bus bar 41 and the collector-side bus bar 46 of the semiconductor circuit 100.

Hereinafter, the operations in the semiconductor circuit 100 and the semiconductor power conversion device 1 when causing the semiconductor switch 30 to switch to the off state will be described on the basis of FIG. 2. FIG. 2 is a circuit diagram illustrating a flow of a current at the time of turning off the first semiconductor switch 31 to the third semiconductor switch 33 in the semiconductor power conversion device 1 including the semiconductor circuit 100 according to the first embodiment of the present invention.

First, the supply of a positive voltage with respect to the emitter terminals is started to the respective gate terminals of the first semiconductor switch 31 to the third semiconductor switch 33 by control of the control unit of the gate drive circuit 10, and all the three semiconductor switches 30 in the off state are switched to the on state. With the transition, current values in the collector terminals of the first semiconductor switch 31 to the third semiconductor switch 33 are increased.

Next, the positive voltage supplies to the respective gate terminals of the first semiconductor switch 31 to the third semiconductor switch 33 are stopped by control of the control unit of the gate drive circuit 10, and all the three semiconductor switches 30 in the on state are switched to the off state. At this time, a delay may occur in the timing of switching to the off state in any of the semiconductor switches 30 due to individual variation of the three semiconductor switches 30. Here, for example, assume that a delay in timing of switching to the off state occurs in only the second semiconductor switch 32.

In the situation described above, the currents flowing in the first semiconductor switch 31 and the third semiconductor switch 33, which are in the off state earlier than the second semiconductor switch 32, flow into the second semiconductor switch 32, as illustrated by the arrows A in FIG. 2, and a potential of the emitter terminal of the second semiconductor switch 32 is increased. As a result, as illustrated by the arrow B in FIG. 2, the increased potential in the emitter terminal of the second semiconductor switch 32 is applied to the primary-side winding of the second transformer 22 provided between the second semiconductor switch 32 and the gate drive circuit 10. Further, as illustrated by the arrows C in FIG. 2, the increased potential in the emitter terminal of the second semiconductor switch 32 is applied to the emitter-side bus bars 41, 42, and 43 electrically connected to the emitter of the second semiconductor switch 32.

At this time, the currents in opposite directions to each other flow in the emitter-side bus bars 41, 42, and 43, and the collector-side bus bars 46, 47, and 48. Therefore, the inductance generated on the emitter-side bus bars 41, 42, and 43 side and the inductance generated on the collector-side bus bars 46, 47, and 48 side are canceled.

However, the respective facing surfaces of the collector-side bus bar 46 and the emitter-side bus bar 41 are separated by and arranged at a predetermined distance due to the formation of the protruding groove portion 411, and thus the binding rate of magnetic flux becomes worse, and the inductance generated on the emitter-side bus bar 41 side and the inductance generated on the collector-side bus bar 46 side are not perfectly canceled or canceled in a less perfect manner. As a result, small inductance is ensured. Similarly, the respective facing surfaces of the collector-side bus bar 47 and the emitter-side bus bar 42 are separated by and arranged at a predetermined distance due to the formation of the protruding groove portion 411, and thus a binding rate of magnetic flux becomes worse, and the inductance generated on the emitter-side bus bar 42 side and the inductance generated on the collector-side bus bar 47 side are not perfectly canceled or canceled in a less perfect manner. As a result, small inductance is ensured. Similarly, the respective facing surfaces of the collector-side bus bar 48 and the emitter-side bus bar 43 are separated by and arranged at a predetermined distance due to the formation of the protruding groove portion 411, and thus a binding rate of magnetic flux becomes worse, and the inductance generated on the emitter-side bus bar 43 side and the inductance generated on the collector-side bus bar 48 side are not perfectly canceled or canceled in a less perfect manner. As a result, small inductance is ensured.

Therefore, a voltage is induced in the secondary-side winding of the second transformer 22, due to mutual induction in the second transformer 22. At this time, since the secondary-side winding of the second transformer 22 is wound in the opposite direction to the primary-side winding of the second transformer 22, the voltage induced in the secondary-side winding of the second transformer 22 facilitates the flow of the current from the gate terminal of the second semiconductor switch 32 to the gate drive circuit 10. That is, a feedback current flows in a direction to advance the second semiconductor switch 32 to switch to the off state. Similarly, when the current is decreased early to promptly switch the first semiconductor switch 31 and the third semiconductor switch 33 to the off state, the transformers 21 and 23 work to block the flow of the current from the gate terminals to the gate drive circuit and operate to suppress variation in turn-off current due to variation in the elements. Then, damage of the second semiconductor switch 32 is suppressed due to flow of a large current in the second semiconductor switch 32. Further, deviation of the current in the collector terminals of the first semiconductor switch 31 and the second semiconductor switch 32 is suppressed, and the current flows in the collector terminals of the first semiconductor switch 31 to the third semiconductor switch 33 in a roughly uniform manner.

According to the present embodiment, the following effect is exhibited. In the present embodiment, the semiconductor circuit 100 includes the plurality of semiconductor switches 30 connected in parallel to one another and forming arms between the positive and negative poles P and U of the DC power supply, and the gate drive circuit 10 as a drive circuit that causes the plurality of semiconductor switches 30 of the arms to switch to the on state or the off state at the same time. The gate drive circuit 10 includes means to detect a short circuit of the semiconductor switch 30 and to cause the short-circuited semiconductor switch 30 to switch to the off state. The inter-switch current suppression portion 20 is electrically connected to the emitter auxiliary lines 311, 321, 331, 312, 322, and 332 and the signal lines 313, 323, 333, 314, 324, and 334 between the gate drive circuit 10, and the gate terminals as control signal input terminals and the emitter terminals as current output terminals, of the semiconductor switches 30. The inter-switch current suppression portion 20 includes the oppositely wound coils facing each other, and configures the semiconductor power conversion device 1 that facilitates the semiconductor switches 30 to switch to the off state with the gate drive circuit 10, using the inter-switch current flowing between current output terminals of the plurality of semiconductor switches 30. The current lead wires connected from the positive pole P to the collector terminals of the semiconductor switches 30 are configured from the collector-side bus bars 46, 47, and 48 branched in an equal manner from the collector terminals of the adjacent semiconductor switches 30. The current lead wires connected from the emitter-side terminals of the semiconductor switches 30 to the negative pole U are configured from the emitter-side bus bars 41, 42, and 43 branched in an equal manner to the emitter terminals of the adjacent semiconductor switches 30. The collector-side bus bars 46, 47, and 48 and the emitter-side bus bars 41, 42, and 43 are arranged in parallel in a state of being isolated from each other and are fitted in a fixed manner to each other. The emitter-side bus bars 41, 42, and 43 are provided with the protruding groove portion 411 as an inductance generation portion that generates a difference in inductance between the collector-side bus bars 46, 47, and 48 and the emitter-side bus bars 41, 42, and 43.

Therefore, the respective facing surfaces of the collector-side bus bars 46, 47, and 48 and the emitter-side bus bar 41, 42, and 43 are separated by and arranged at a predetermined distance due to the formation of the protruding groove portion 411, and thus the binding rate of magnetic flux becomes worse, and the inductance generated on the emitter-side bus bars 41, 42, and 43 side and the inductance generated on the collector-side bus bars 46, 47, and 48 side are not perfectly canceled or canceled in a less perfect manner. As a result, small inductance is ensured.

As a result, in a case where a delay in timing of switching to the off state occurs in any of the semiconductor switches 30 due to individual variation of the plurality of semiconductor switches 30 (the first semiconductor switch 31 to the third semiconductor switch 33), a feedback can be applied to the gate terminal voltage of the delayed semiconductor switch 30, and the delayed semiconductor switch 30 can be promptly switched to the off state. Therefore, a current stopped from flowing in the semiconductor switches 30 already in the off state is prevented from flowing into the delayed semiconductor switch 30 as a large current, and breakdown of the semiconductor switch 30 can be avoided. Especially in a circuit in which a large current flows, even the inductance is generated by the lead wire such as the bus bar and the inductance becomes a cause of a surge voltage, and an unexpected large current flows. In such a circuit, the breakdown of the semiconductor switch 30 can be effectively avoided. Further, the output of the transformer works in a direction of narrowing down the gate voltage by the voltage due to current deviation slightly occurring at the time of turn-off. Therefore, the current deviation occurring can be suppressed to be extremely small.

Then, the inductance generation portion is configured from the protruding groove portion 411 formed in the emitter-side bus bar 41. With the configuration, the inner surface of the protruding portion of the protruding groove portion 411 and the surface of the flat collector-side bus bar 46 are separated by and arranged at a predetermined distance, and the binding rate of magnetic flux can be worse.

Figure 6A:
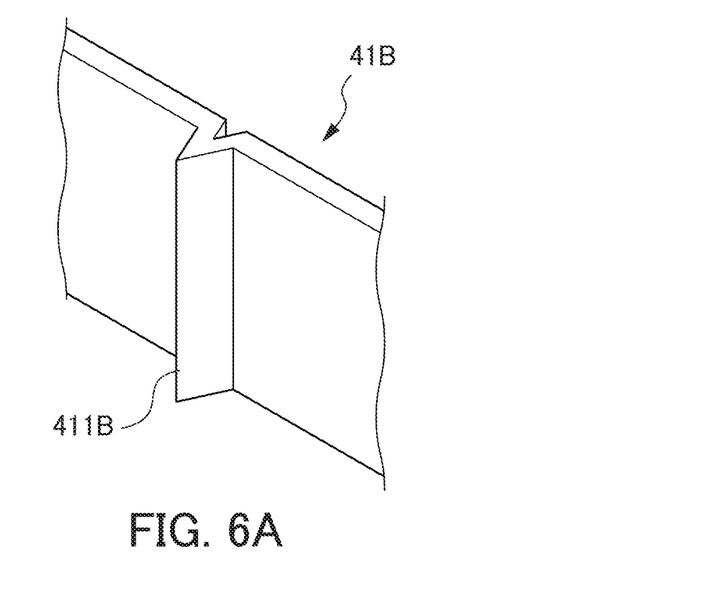
FIG. 6A is a perspective view and FIG. 6B is a side view, illustrating an emitter-side bus bar 41B according to a second embodiment of the present invention.
Figure 6B:
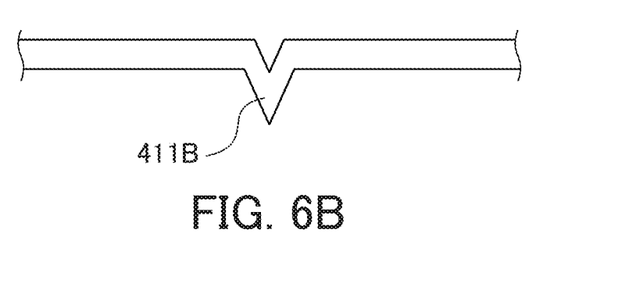

Next, a second embodiment of the present invention will be described in detail with reference to the drawings. FIG. 6A is a perspective view and FIG. 6B is a side view, illustrating an emitter-side bus bar 41B according to the second embodiment of the present invention. Hereinafter, the same configuration as that of the above-described first embodiment is denoted with the same signs, and a detailed description thereof is omitted. A semiconductor circuit according to the present embodiment is different from the first embodiment in a configuration of an inductance generation portion.

An emitter-side bus bar 41B includes a protruding groove portion 411B as an inductance generation portion. The protruding groove portion 411B forms a V-shaped groove, and extends, as illustrated in FIG. 6A, in a middle of the emitter-side bus bar 41B from one end edge to the other end edge of the width of the emitter-side bus bar 41B in a width direction of the emitter-side bus bar 41B.

The protruding groove portion 411B is depressed in one surface of the plate-like emitter-side bus bar 41B, and protrudes from the other surface of the plate-like emitter-side bus bar 41B by the amount of depression in the one surface of the emitter-side bus bar 41B.

Figure 7:
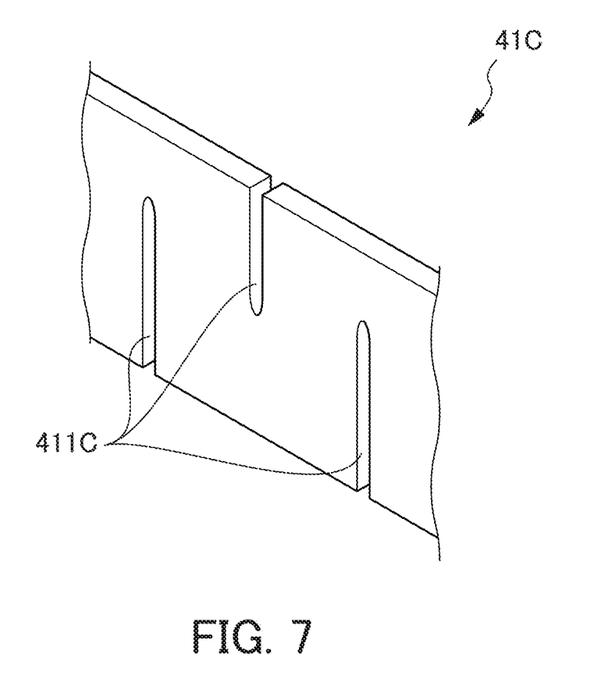
FIG. 7 is a perspective view illustrating an emitter-side bus bar 41C of a semiconductor circuit according to a third embodiment of the present invention.

Next, a third embodiment of the present invention will be described in detail with reference to the drawing. FIG. 7 is a perspective view illustrating an emitter-side bus bar 41C of a semiconductor circuit according to a third embodiment of the present invention. Hereinafter, the same configuration as that of the above-described first embodiment is denoted with the same signs, and a detailed description thereof is omitted. A semiconductor circuit according to the present embodiment is different from the first embodiment in a configuration of an inductance generation portion.

The emitter-side bus bar 41C has a slit 411C as an inductance generation portion. The slit 411C extends, as illustrated in FIG. 7, in a middle of the emitter-side bus bar 41C from one end edge to the other end edge of the width of the emitter-side bus bar 41C in a width direction of the emitter-side bus bar 41C to reach a predetermined position. Further, the slit 411C extends, as illustrated in FIG. 7, in a middle of the emitter-side bus bar 41C from the other end edge to the one end edge of the width of the emitter-side bus bar 41C in the width direction of the emitter-side bus bar 41C to reach a predetermined position. The slits 411C having different slit directions are alternately formed in a direction (a direction connecting the lower right and the upper left in FIG. 7) orthogonal to the width direction of the emitter-side bus bar 41C.

According to the present embodiment, the following effect is exhibited. In the present embodiment, the inductance generation portion is configured from the slits 411C formed in the emitter-side bus bar 41C. Therefore, the respective facing surfaces of a collector-side bus bar 46 and the emitter-side bus bar 41C are separated by and arranged at a predetermined distance due to the formation of the slits 411C by the amount of the slits 411C, and thus a binding rate of magnetic flux becomes worse, and inductance generated on the emitter-side bus bar 41C side and inductance generated on the collector-side bus bar 46 side are not perfectly canceled or canceled in a less perfect manner.

Figure 8A:
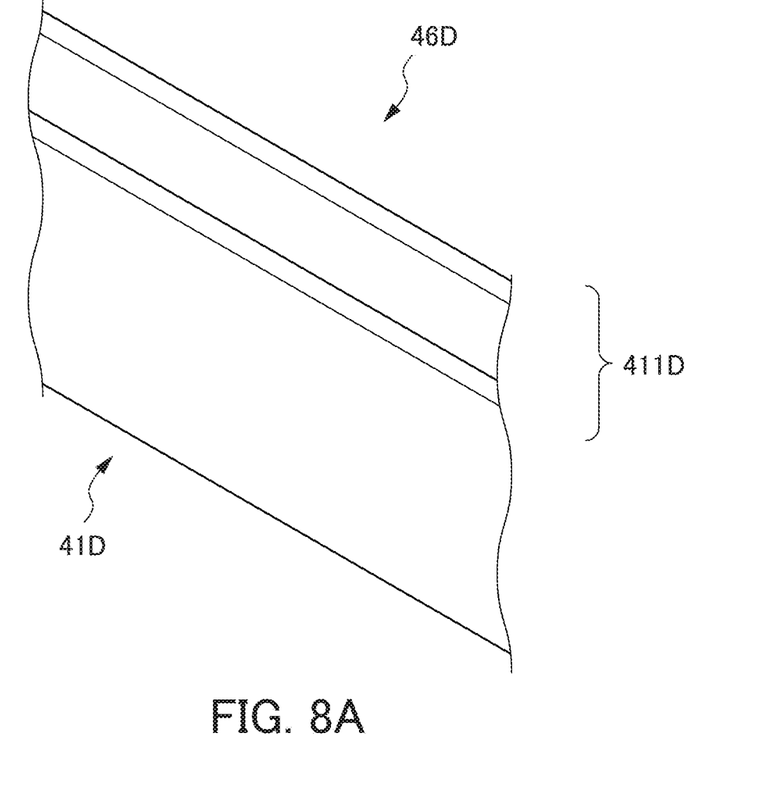
FIG. 8A is a perspective view and FIG. 8B is a side view, illustrating an emitter-side bus bar 41D of a semiconductor circuit according to a fourth embodiment of the present invention.
Figure 8B:
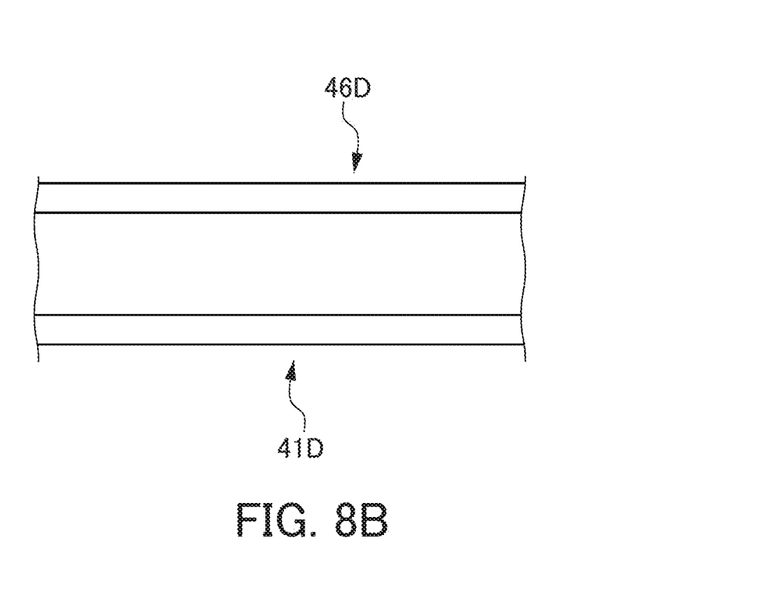

Next, a fourth embodiment of the present invention will be described in detail with reference to the drawings. FIG. 8A is a perspective view and FIG. 8B is a side view, illustrating an emitter-side bus bar 41D of a semiconductor circuit according to a fourth embodiment of the present invention. Hereinafter, the same configuration as that of the above-described first embodiment is denoted with the same signs, and a detailed description thereof is omitted. A semiconductor circuit according to the present embodiment is different from the first embodiment in a configuration of an inductance generation portion.

The emitter-side bus bar 41D includes an inter-bus bar separation portion 411D which a collector-side bus bar 46D and the emitter-side bus bar 41D are separated by and arranged at a predetermined distance, as an inductance generation portion. The predetermined distance in the inter-bus bar separation portion 411D is a distance that ensures slight inductance, in which inductance generated on the emitter-side bus bar 41D side and inductance generated on the collector-side bus bar 46D side do not perfectly canceled each other.

According to the present embodiment, the following effect is exhibited. In the present embodiment, the inductance generation portion is configured from the inter-bus bar separation portion 411D, which is a portion which the collector-side bus bar 46D and the emitter-side bus bar 41D are separated by and arranged at a predetermined distance. The respective facing surfaces of the collector-side bus bar 46D and the emitter-side bus bar 41D are separated by and arranged at the predetermined distance, and thus a binding rate of magnetic flux becomes worse. Therefore, the collector-side bus bar 46D and the emitter-side bus bar 41D can be configured into the same shape to configure the inductance generation portion. Therefore, a semiconductor circuit can be configured without applying special processing to the emitter-side bus bar 41D and the collector-side bus bar 46D.

The present invention is not limited to the above-described embodiments, and alternates, improvements, and the like within the scope where the object of the present invention can be achieved are included in the present invention. For example, in the first to third embodiments, the inductance generation portions are configured by the formation of the protruding groove portion 411 as a U-shaped groove, the protruding groove portion 411B as a V-shaped groove, and the slits 411C in the emitter-side bus bars 41, 41B, and 41C. However, embodiments are not limited to thereto.

For example, the U-shaped groove, the V-shaped groove, and the slits may be formed in the collector-side bus bars instead of the emitter-side bus bars to configure the inductance generation portions. Further, the U-shaped groove, the V-shaped groove, and the slits may be formed in the emitter-side bus bars and the collector-side bus bars to configure the inductance generation portions. In this case, the dimensions and shapes of the U-shaped groove, the V-shaped groove, and the slits formed in the emitter-side bus bar and the U-shaped groove, the V-shaped groove, and the slits formed in the collector-side bus bar are differentiated to allow the respective facing surfaces of the collector-side bus bar and the emitter-side bus bar to be separated by and arranged at a predetermined distance. As a result, the binding rate of magnetic flux becomes worse, and the inductance generated on the emitter-side bus bar side and the inductance generated on the collector-side bus bar side are not perfectly canceled or canceled in a less perfect manner.

Further, the members (components) and the number of the members that configure the semiconductor power conversion device are not limited to the number of the members (components) that configure the semiconductor power conversion device 1 in the present embodiment. For example, in the present embodiment, the three semiconductor switches 30 including the first semiconductor switch 31 to the third semiconductor switch 33 are provided. However, the number of the semiconductor switches 30 is not limited to three. For example, the semiconductor power conversion device may include two, or four or more semiconductor switches. In these cases, transformers of the same number as the number of the semiconductor switches are electrically connected to the semiconductor switches on a one-to-one basis.

EXPLANATION OF REFERENCE NUMERALS

1 Semiconductor power conversion device
10 Gate drive circuit (drive circuit)

20 Inter-switch current suppression portion
30 Semiconductor switch
31 First semiconductor switch
32 Second semiconductor switch
33 Third semiconductor switch
41 Emitter-side bus bar
46 Collector-side bus bar
100 Semiconductor circuit
311, 321, 331, 312, 322, and 332 Emitter auxiliary line (signal line)
313, 323, 333, 314, 324, and 334 Signal line
411 and 411B Protruding groove portion
411C Slit
411D Inter-bus bar separation portion
P Positive pole
U AC output terminal (negative pole)

What is claimed is:

1. A semiconductor circuit comprising:
a plurality of semiconductor switches arranged in parallel to one another and configuring arms connected between positive and negative poles of a DC power supply; and
a drive circuit configured to cause the plurality of semiconductor switches of the arms to switch to an on state or an off state at the same time, wherein,
the drive circuit includes means to detect a short circuit of a semiconductor switch and cause the short-circuited semiconductor switch to switch to the off state,
an inter-switch current suppression portion is electrically connected to signal lines between the drive circuit, and control signal input terminals and current output terminals of the semiconductor switches,
the inter-switch current suppression portion is a semiconductor circuit including oppositely wound coils facing each other, and configuring a semiconductor power conversion device that facilitates the semiconductor switches to switch to the off state with the drive circuit, using the inter-switch current flowing between the current output terminals of the plurality of semiconductor switches,
a current lead wire connected from the positive pole to collector terminals of the semiconductor switches is configured from a collector-side bus bar branched in an equal manner from the collector terminals of the adjacent semiconductor switches,
a current lead wire connected from emitter-side terminals of the semiconductor switches to the negative pole is configured from an emitter-side bus bar branched in an equal manner to the emitter terminals of the adjacent semiconductor switches,
the collector-side bus bar and the emitter-side bus bar are arranged in parallel in a state of being isolated from each other and are fitted in a fixed manner to each other, and
an inductance generation portion is provided in one or both of the collector-side bus bar and the emitter-side bus bar, the inductance generation portion generating a difference in inductance between the collector-side bus bar and the emitter-side bus bar.

2. The semiconductor circuit according to claim 1, wherein the inductance generation portion is configured from a groove formed in at least one of the collector-side bus bar and the emitter-side bus bar.

3. The semiconductor circuit according to claim 1, wherein the inductance generation portion is configured from a slit formed in at least one of the collector-side bus bar and the emitter-side bus bar.

4. The semiconductor circuit according to claim 1, wherein the inductance generation portion is configured from a portion which the collector-side bus bar and the emitter-side bus bar are separated by and arranged at a predetermined distance.

* * * * *